United States Patent [19]

Hiwatashi

[11] Patent Number: 4,903,214

[45] Date of Patent: Feb. 20, 1990

[54] METHOD FOR WIRING SEMICONDUCTOR INTEGRATED CIRCUIT DEVICE

[75] Inventor: Tamotsu Hiwatashi, Yokohama, Japan

[73] Assignee: Kabushiki Kaisha Toshiba, Kawasaki, Japan

[21] Appl. No.: 135,085

[22] Filed: Dec. 18, 1987

[30] Foreign Application Priority Data

Dec. 26, 1986 [JP] Japan ................. 61-315340
Mar. 31, 1987 [JP] Japan .................. 62-78572

[51] Int. Cl.$^4$ .................. G06F 15/60; G06F 15/20
[52] U.S. Cl. ........................ 364/491; 364/300
[58] Field of Search ............ 364/488, 489, 490, 491, 364/200, 300, 900 MS File

[56] References Cited

U.S. PATENT DOCUMENTS

| | | | |
|---|---|---|---|
| 3,653,071 | 3/1972 | Hill et al. | 364/491 X |
| 3,653,072 | 3/1972 | Ballas et al. | 364/491 X |
| 3,654,615 | 4/1972 | Freitag | 364/491 |
| 4,484,292 | 11/1984 | Hong et al. | 364/491 |
| 4,593,351 | 6/1986 | Hong et al. | 364/200 |
| 4,593,363 | 6/1986 | Burstein et al. | 364/491 |
| 4,615,011 | 9/1986 | Linsker | 364/491 |
| 4,630,219 | 12/1986 | DiGiacomo et al. | 364/488 |
| 4,636,965 | 1/1987 | Smith et al. | 364/491 |
| 4,742,471 | 5/1988 | Yoffa et al. | 364/490 X |

OTHER PUBLICATIONS

VLSI SYSTEM DESIGN "Place and Route Strategies"; J. Soukup; Nov. 1986.

Primary Examiner—Parshotam S. Lall
Assistant Examiner—Edward R. Cosimano
Attorney, Agent, or Firm—Oblon, Spivak, McClelland, Maier & Neustadt

[57] ABSTRACT

A method for wiring a semiconductor integrated circuit device includes a first step of assigning wiring routes for globally wiring cells of a plurality of cell rows to the cell arrays and the channel regions, in accordance with a wiring request for realizing a predetermined circuit operation, so as to obtain a plurality of nets, a second step of extracting X lines, extending along the channel regions, from the nets, a third step of combining the X lines in a plurality of line groups, in accordance with X-coordinates of the X lines, and assigning the line groups to tracks of the channel regions, and a fourth step of determining a position of at least one cell row through which a Y line of the net passes, in order to connect the cells corresponding to the nets via the corresponding X lines.

13 Claims, 14 Drawing Sheets

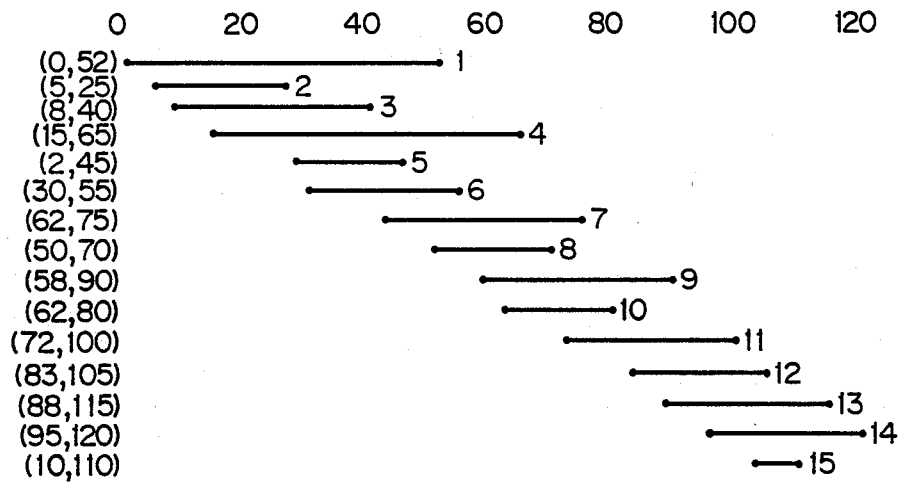
F I G. 6
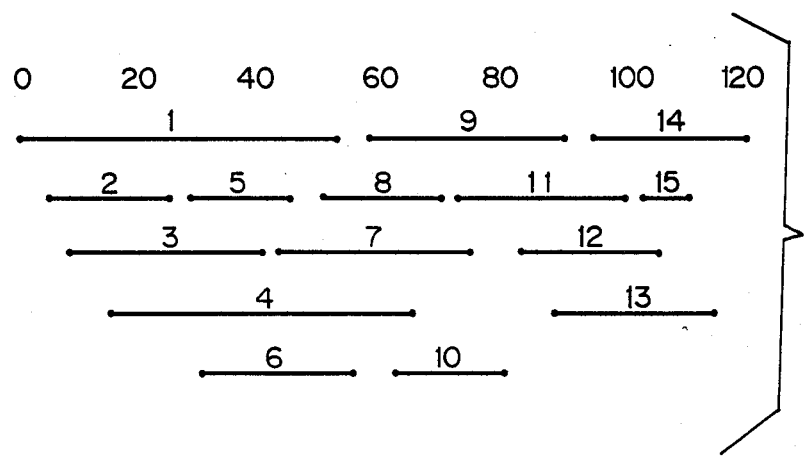
F I G. 7

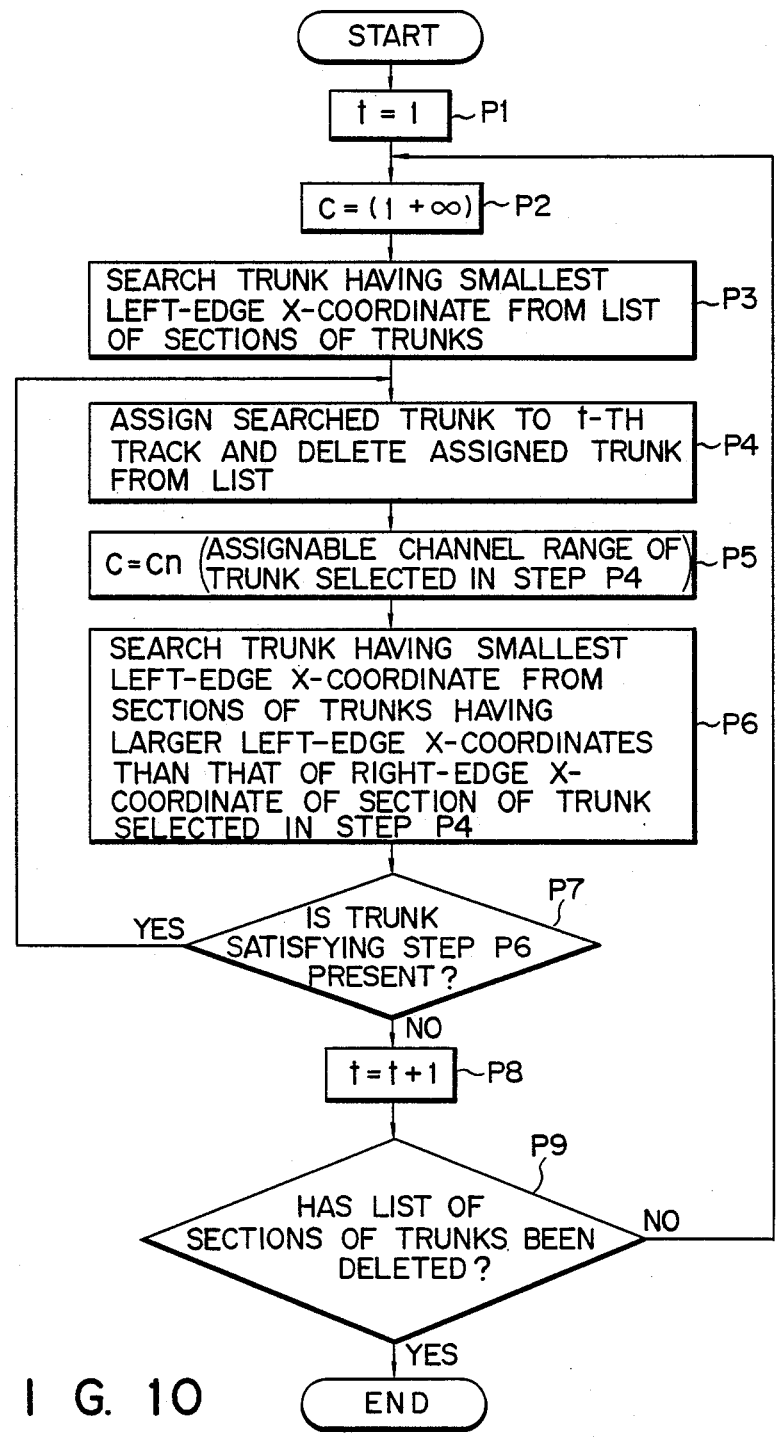
F I G. 10

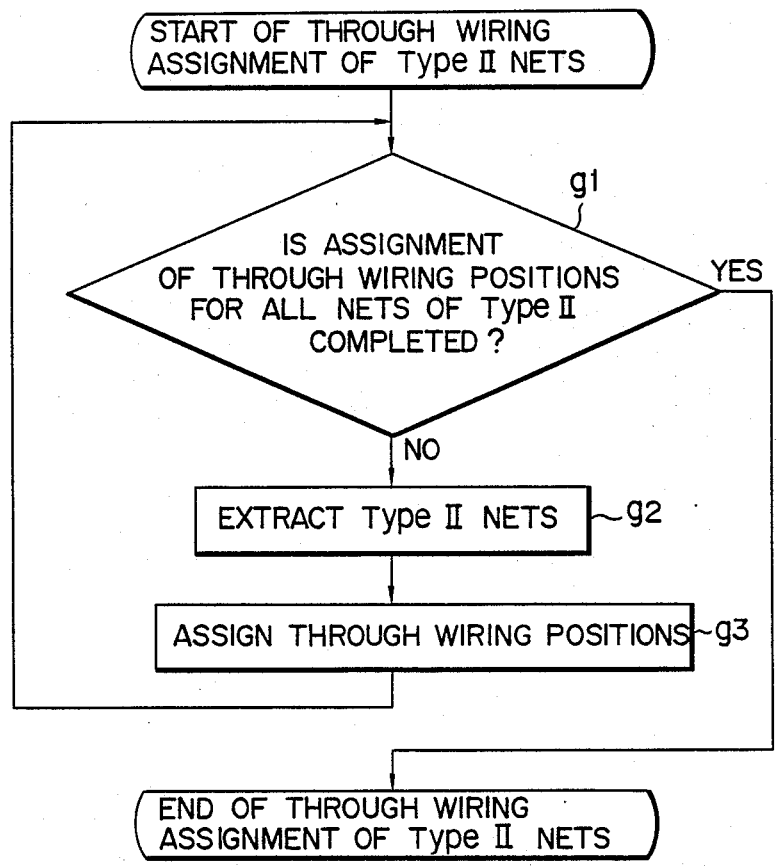
F I G. 15

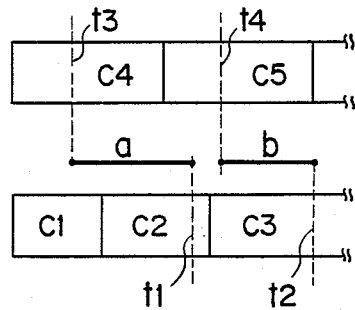
F I G. 16A
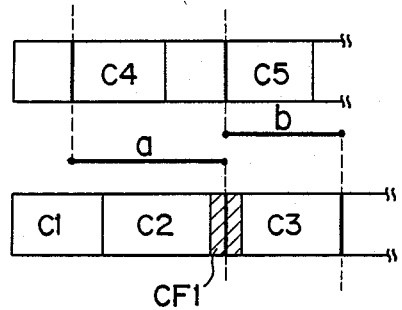
F I G. 16B
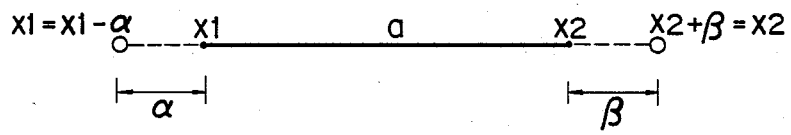
F I G. 17

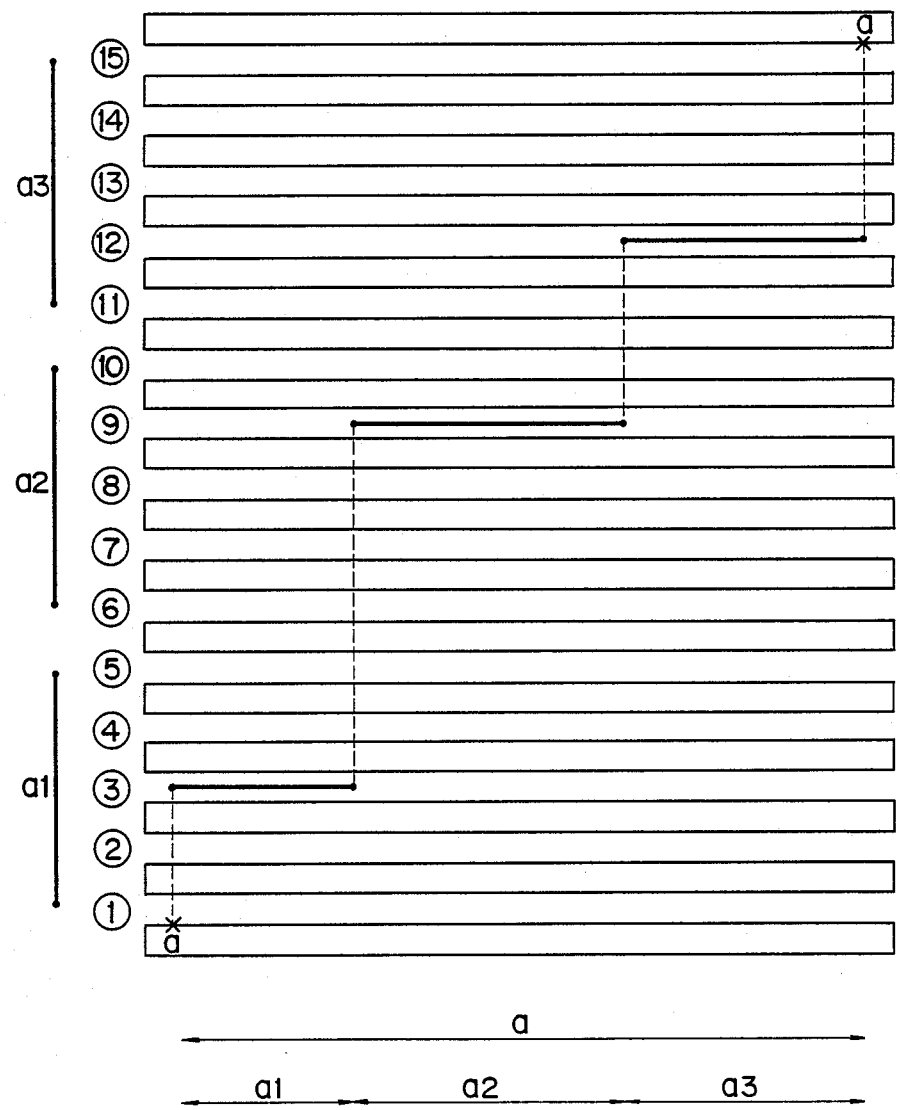
F I G. 18

METHOD FOR WIRING SEMICONDUCTOR INTEGRATED CIRCUIT DEVICE

BACKGROUND OF THE INVENTION

The present invention relates to a wiring method for automatically determining a wiring route between cells using a computer in a polycell style semiconductor integrated circuit device.

In a polycell style semiconductor integrated circuit device, a circuit having a logic or memory function is normally constituted by a region, known as a circuit cell (to be hereinafter referred to simply as a cell), rectangular in shape and of uniform height. The cells are arranged in line, without gaps therebetween, to constitute a cell row. A plurality of cell rows are arranged on a chip, and terminals of the cells are connected via a wiring segment, thus realizing a desired circuit operation. A cell has a pattern designed in advance, e.g., NAND, NOR, flip-flop, or the like. Using this wiring method, a complicated and large-scale circuit system can be relatively easily realized as a semiconductor integrated circuit device.

In a normal polycell style semiconductor integrated circuit chip, a plurality of cell rows are aligned on the chip, and wiring regions are formed between adjacent cell rows. Arranged around the chip is an I/O circuit region. The wiring regions, i.e., the channel regions, serve as interconnection regions for interconnecting the I/O terminals of the cells. The interconnections normally employ two metal interconnection layers, and different layers are assigned in the horizontal and vertical directions. The area of each channel region is not always predetermined, but is normally determined by the number of tracks required for interconnections after completion of the wiring operation.

Normally, each cell row includes portions through which metal conductors of the second layer can pass. Wiring which must extend over a plurality of cell rows (wiring passing through such a wiring route is called "feed-through wiring") is carried out across the cells through which the metal wiring layer can pass. When the number of cells through which the metal wiring layer can pass is few as compared to the number of wiring routes requiring the feed-through wiring, a feed-through cell is used, and the feed-through wiring is performed across the cell.

When, in the polycell style semiconductor integrated circuit device as described above, a wiring layout is determined by automatic wiring using a computer, the area of the wiring region must be minimized, as must also the lengths of wiring lines. A typical known wiring method is the channel wiring method, wherein a wiring region is divided into a plurality of channels, and the wiring layout is determined for each channel. The channel wiring method allows high-speed processing using a computer, and can achieve an almost 100% wiring ratio.

In the case of the conventional channel wiring method, the wiring direction of terminals is selected for each of the nets (groups of terminals to be connected to an identical potential). In this case, it is selected if a wiring segment from a terminal of interest is connected to an adjacent channel in a cell row on which the cell of interest is present, or if the wiring segment is connected to an adjacent channel below the cell of interest, or if the wiring segment is connected to both the channels. Upon computer processing for the above selection, the presence/absence of a wiring inhibition region in a cell, reduction of a wiring region, and the like are taken into account. Nets (nets requiring the feed-through wiring) which must extend over a cell row are sequentially extracted in a given order, and positions on a cell row through which the wiring segment passes are determined for the extracted net. Using this method, the general wiring route of the net requiring the feed-through wiring is also determined, at the same time. General wiring is also called "global wiring". After completion of the global wiring, the channel wiring operation is then sequentially executed for each channel.

Since, by using this method, feed-through cell assignment for the feed-through wiring and channel assignment, for determining the wiring route, is sequentially determined for each net requiring the feed-through wiring in the global wiring operation, these assignments cannot be synthetically determined for all the channels, with the result that the degree of concentration of the wiring segments varies from channel to channel. Consequently, the channel area is undesirably increased, and the degree of integration cannot be improved to the degree desired. More specifically, since the nets are sequentially processed, the feed-through cell of the currently processed net and a channel for the wiring route are determined on the basis of the cells or channels previously assigned for the feed-through wiring and wiring route. For this reason, it is not easy to optimally assign the cells and channels for the feed-through wiring and wiring route. In the sequential processing, the order of wiring routes for those nets requiring the feed-through wiring influences the resultant wiring state. More specifically, cells or channels assigned to the feed-through wiring or wiring route of each net are changed, depending on the extraction order of nets requiring the feed-through wiring. As a result, the total number of wiring segments used for the wiring of each channel after completion of channel wiring may be changed. Therefore, the height of a wiring region and the area of the chip are likely to change, depending on the order by which nets require the feed-through wiring. Thus, it is very difficult to optimally assign the feed-through cells or channels.

As has been described above, when using the conventional global wiring method in relation to the polycell style semiconductor integrated circuit device, it is difficult to optimize the assignment of the feed-through cell and channels for determining the wiring route for nets requiring through-wiring. As a result, the area of the wiring region is likely to be increased, so that the degree of integration of the chip cannot be improved to a sufficiently satisfactory degree.

SUMMARY OF THE INVENTION

It is an object of the present invention to provide a method of wiring a semiconductor integrated circuit device wherein position assignment for a feed-through wiring and channel assignment for determining a wiring route can be optimally performed.

According to the present invention, in a semiconductor integrated circuit device having a plurality of cell rows which are aligned parallel to each other through channels, terminal positions for through wiring and wiring routes for connecting terminals are determined for each net requiring a feed-through wiring, thereby determining a plurality of global wiring routes. Line segments in a direction parallel with the channel direction are extracted from the global wiring routes, and a plurality of extracted line segments are divided among a plurality of line segment groups, in accordance with relationships of lengths of the wiring segments and positions of the through wiring terminals. Each line segment group is assigned to an optimal channel in consideration of the through wiring position, thereby simultaneously determining wiring positions for all the nets.

Since a plurality of trunks are integrally combined at a time in accordance with the relationships of the lengths of the wiring lines and positions of the through-wiring terminals, through-wiring position assignment for nets requiring through-wiring and trunk assignment to channels can be simultaneously determined, using a minimum number of tracks. As a result, an almost optimal assigning of trunks to channels, and through-wiring position assignment determined accordingly, can be always be realized. Thus, the area of a wiring region can be most effectively compressed while simultaneously taking advantage of a channel wiring method which can achieve an almost 100% wiring ratio.

BRIEF DESCRIPTION OF THE DRAWINGS

FIGS. 5 to 7 are views showing detailed wiring procedures;

FIG. 10 is a flow chart showing procedures of executing channel assignment shown in FIG. 9;

FIG. 15 is a flow chart showing through wiring position assignment associated with one type of net;

FIGS. 16A and 16B are views for explaining problems when a wiring passage inhibition region is present in the cell;

FIG. 17 is a view for explaining a method for solving the problems; and

FIG. 18 is a view showing an example of divisional arrangement of necessary main lines.

DETAILED DESCRIPTION OF THE PREFERRED EMBODIMENTS

Figure 1:
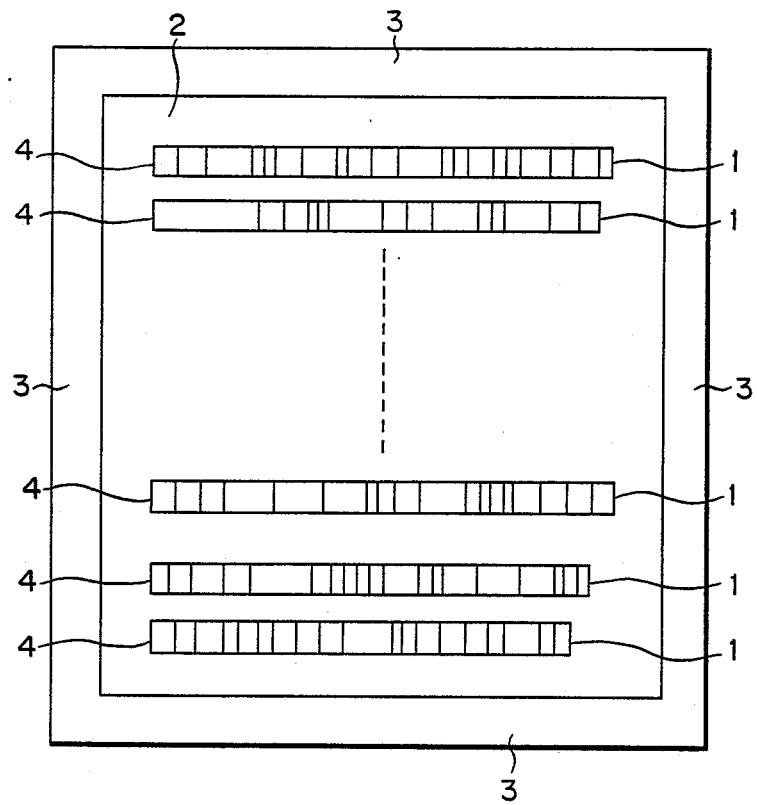
FIG. 1 is a view showing a schematic structure of a polycell style integrated circuit chip.

FIG. 1 shows a polycell style semiconductor integrated circuit chip. With this chip, a plurality of cell rows 1 are arranged parallel to each other. Each cell row 1 is constituted by a plurality of cells. Wiring region 2 called a channel is arranged between two adjacent cell rows 1. I/O circuit region 3 is arranged around the chip.

Wiring segments for connecting cells 4 through I/O terminals of each cell 4 are provided to wiring region 2. As the wiring segments, two-layered metal wiring layers are employed, and independently extend in horizontal and vertical directions (X and Y directions).

Figure 2:
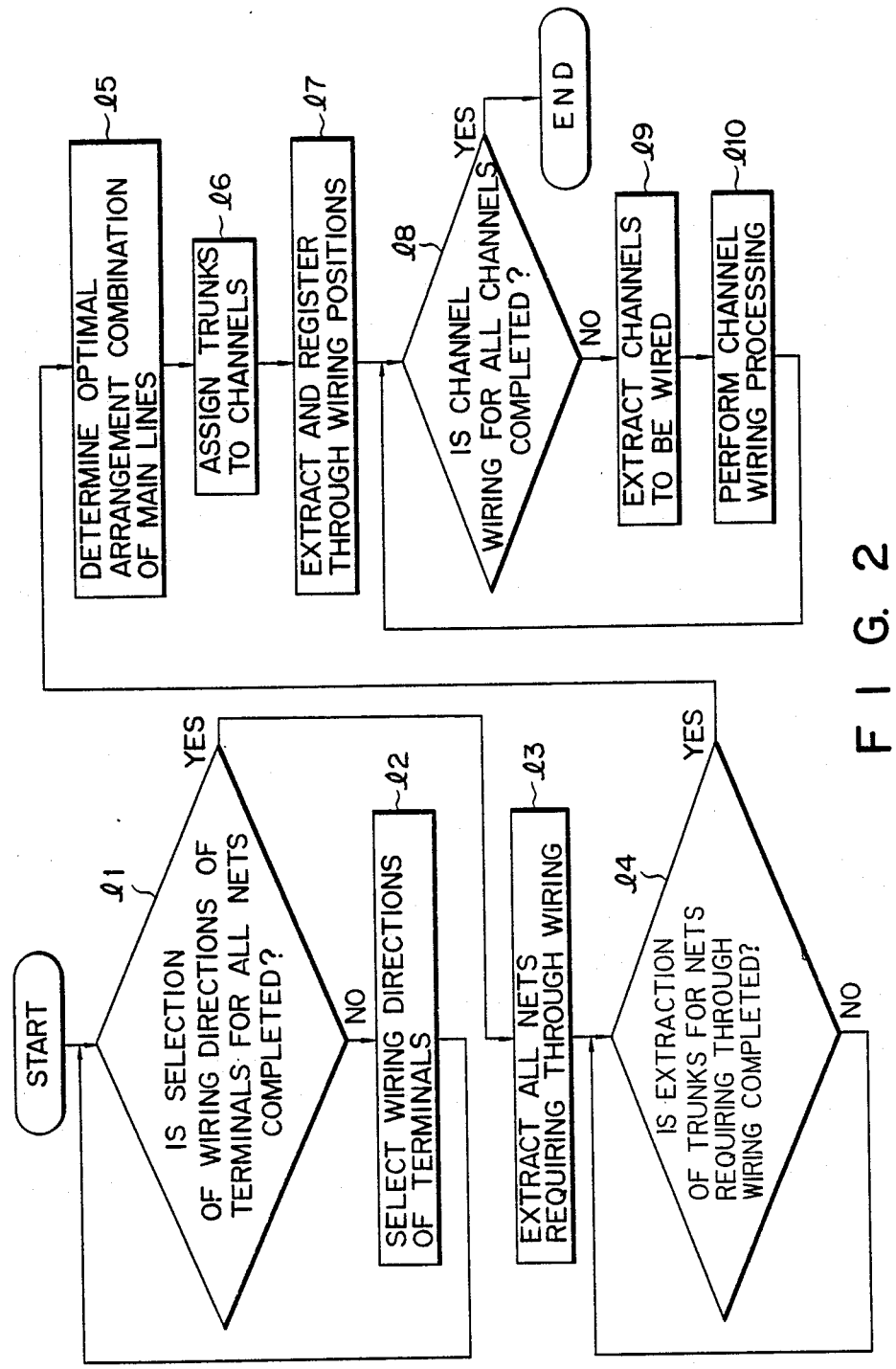
FIG. 2 is a flow chart for explaining a wiring method according to an embodiment of the present invention.

When wiring for the chip shown in FIG. 1 is performed, it is executed in accordance with the flow chart shown in FIG. 2.

After the flow starts, wiring directions of terminals for all the nets are selected (steps 11 and 12). If the selection of wiring directions is not completed, the flow proceeds form step 11 to step 12 where the wiring directions of terminals are selected whereupon the flow loops back to 11 step until the selection of terminals is complete. If the selection of terminals is determined to have been completed in step 11, the flow proceeds to step 13. More specifically, in these steps, leading directions of wiring segments from cell 4 are selected. For example, it is selected if the wiring segment is led to an adjacent channel above the cell row including cell 4 to be connected, or if the wiring segment is led to an adjacent channel below the cell row, or the wiring segment is led to both the channels. Upon leading of wiring, wiring routes for interconnecting cells 4 of different cell rows are formed on the chip as nets. The nets can be classified to those including a trunk (X line) extending along a channel and a branch (Y line) perpendicular to the trunk and passing through the cell row, and those including the trunk but including no branch passing through the cell row. When a route of each net is determined, a wiring inhibition cell region and minimization of a wiring length are taken into account.

All the nets which must pass through the cell rows, i.e., all the nets requiring a through wiring are extracted (step 13). In this case, the nets are sequentially extracted in accordance with a predetermined order. Subsequently, necessary trunks are extracted for each net requiring the through wiring (step 14). More specifically, of two terminals belonging to each net, a section (line segment) from a terminal exhibiting a minimum X-coordinate to a maximum X-coordinate is defined as a necessary main line. If in step 14 it is determined that the extraction of trunks for nets requiring through wiring has been completed, the flow proceeds to step 15. The flow will continue to loop back around and trough step 14 until it has been determined that the extraction of trunks has been completed.

An optimal arrangement of trunks, which have been extracted, is determined (step 15). In the conventional method, it is determined which trunks should be assigned to which channel. In the present invention, it is determined how the trunks should be combined into groups, and which group of trunks should be provided in which track of which channel, such that all trunks can be arranged in the smallest possible number of tracks. For determination of the combination, some algorithms have been proposed. For example, if the left-edge algorithm (literature: A. Hashimoto, S. Stevens, "Wire routing by optimizing channel assignment within large apertures", Proc. 8th Design Automation Workshop, pp. 155-169, 1971) is employed, the main lines can be arranged using the minimum number of tracks.

The trunks are assigned to the channels based on the arrangement result of the trunks (step 16). More specifically, the trunks arranged on an identical track are assigned to an identical channel. When an operation for assigning the trunks to the channels is completed, a cell assigned to a feed-through wiring and a cell position (X-coordinate) in the cell row including this cell are determined for each net, and the through wiring positions assigned onto the cell rows are registered (step 17).

With the above processing, global wiring processing is ended. Subsequently, channel wiring processing is executed for each channel (steps 18 to 110). If the channel wiring for all channels is determined to have been completed (step 18), the flow ends. However, if it is determined in step 18 that the channel wiring has not been completed, channels are extracted to be wired (step 19) and channel wire processing is performed (step 110) before the flow loops back to step 18. During the channel wiring, a channel to be wired is extracted from the channels assigned by the global wiring (step 18). The wiring operation is executed for the extracted channel. Upon completion of a single wiring operation, it is checked if all the channels are wired. Thereafter, a next channel to be wired is extracted. When the wiring operation of the new channel is completed, control returns to the check flow (step 18). In this manner, when the wiring operation of all the channels is completed, an inter-block wiring operation is ended.

Figure 3:
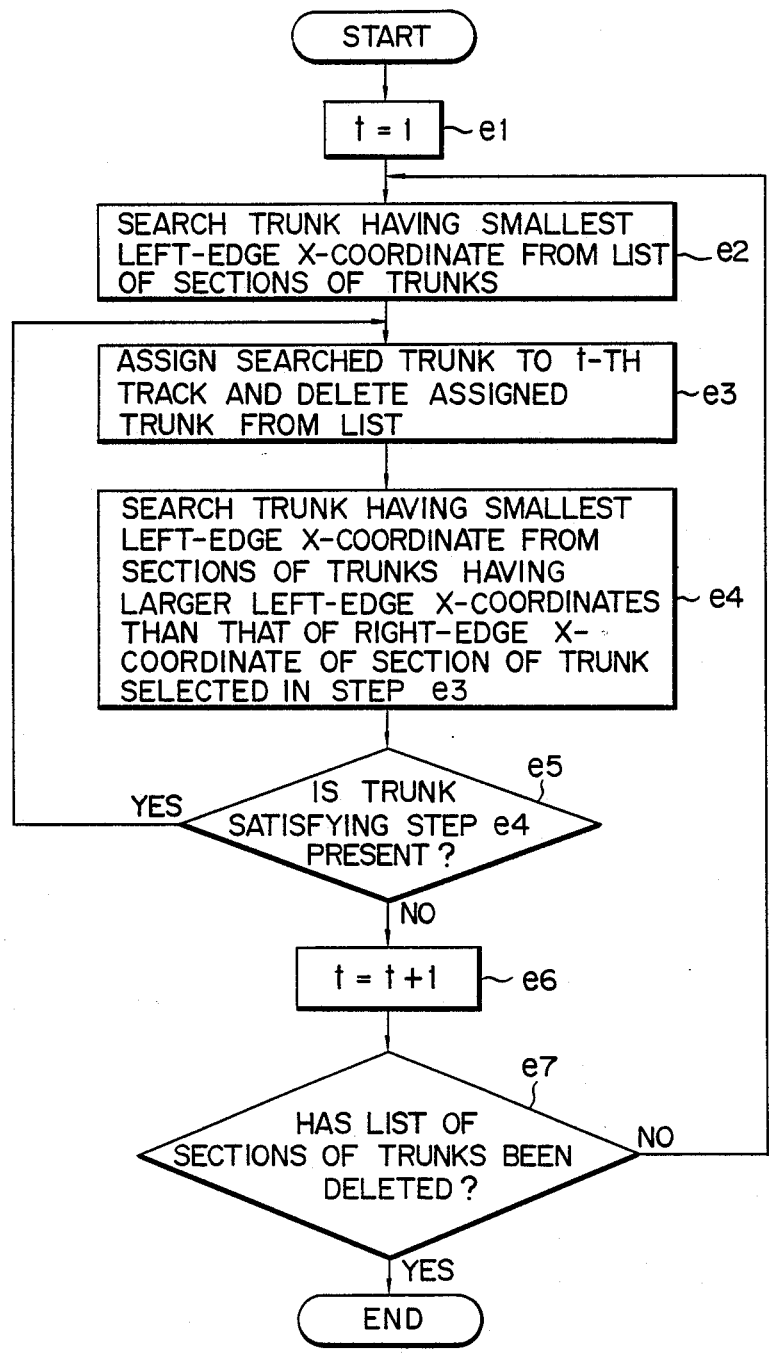
FIG. 3 is a flow chart for assigning main lines to channels in accordance with the left-edge algorithm.

The left-edge algorithm used for determining a combination of trunks will be described in detail. FIG. 3 is a flow chart showing procedures for determining assignment of the trunks to virtual tracks and combination of the trunks.

After the flow starts, t=1 is set (step e1). In this case, t indicates the total number of tracks when trunks are assigned. Then, a trunk having a smallest left-edge X-coordinate is searched from the list of sections of the trunks (step e2). The searched trunk is assigned to a t-th track and is deleted from the list (step e3). A trunk having the smallest left-edge X-coordinate is searched from the list of sections of the trunks having larger left-edge X-coordinates than the right-edge X-coordinate of the section of the trunk selected in step e4 (step e4). If YES in step e5, i.e., if a trunk satisfying step e4 is present, the flow returns to step e4, and the searched trunk is assigned to the t-th track. Thereafter, the flow advances to step e4. However, if NO in step e5, a track number is incremented by one (t=t+1) (step e6), and the flow returns to step e2. The above operation is repeated until all the listed sections of the trunks are deleted. Thereafter, the flow ends. In this flow chart, final value t serves as the number of tracks upon completion of assignment and combination of trunks.

Channel assignment of trunks of nets requiring the feed-through wiring and a through wiring assignment process (steps 14 to 17 in FIG. 2) as the characteristic feature of the present invention will be described in detail with reference to FIGS. 4A to 4E.

Figure 4A:
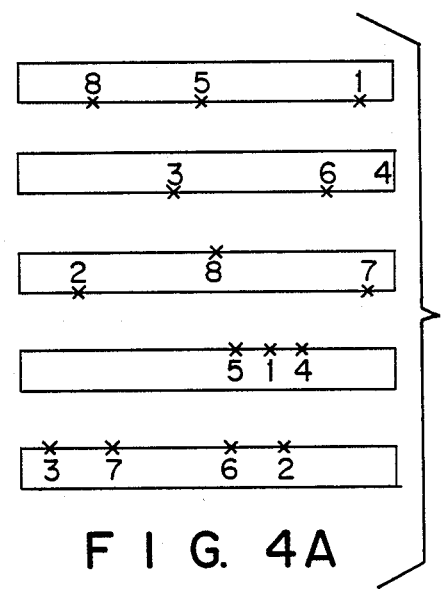
FIGS. 4A to 4E are views showing wiring procedures of the semiconductor integrated circuit.
Figure 4B:
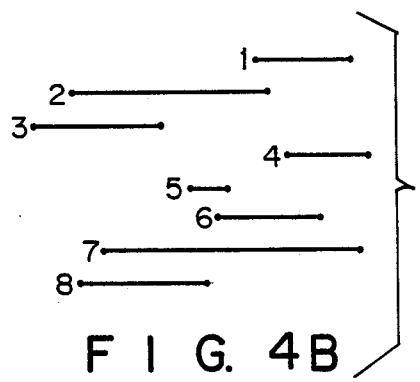
Figure 4C:
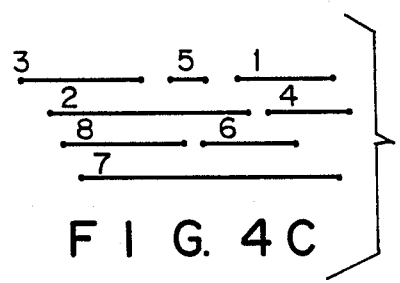

FIG. 4A illustrates cell arrays when processing (steps 11 and 12 in FIG. 2) for determining wiring directions of terminals is completed. In FIG. 4A, 1, 2, . . . , 8 represent names of nets. More specifically, interconnection requests are generated for terminals having identical numbers. FIG. 4B shows necessary trunks extracted for each net. Each line segment indicates a horizontal wiring line segment necessary for connecting the corresponding net. FIG. 4C shows optimally arranged and combined trunks determined by using the left-edge algorithm. Eight tracks required in FIG. 4B can be reduced to four tracks in FIG. 4C, thus obtaining optimal arrangement and combination of trunks.

Figure 4D:
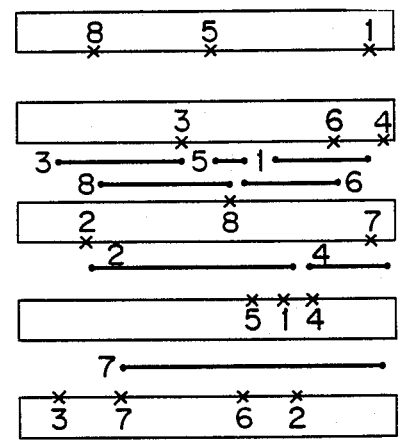

When trunks are assigned to channels in accordance with the result shown in FIG. 4C, the result shown in FIG. 4D can be obtained. More specifically, nets (3, 5, 1) are assigned to an identical channel, and similarly, nets (2, 4) and (8, 6) are assigned to identical channels. Net (7) is assigned to a single channel.

Figure 4E:
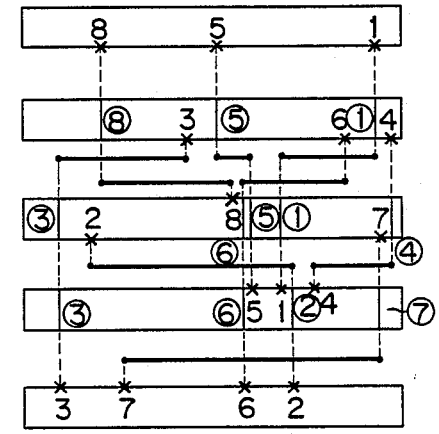

FIG. 4E shows a wiring pattern of a chip wherein a feed-through wiring is assigned onto the cell rows in accordance with the result shown in FIG. 4D. As can be seen from this pattern, four tracks are finally assigned to three channels, and optimal wiring result can be obtained.

In the above embodiment, trunk assignment to channels has been briefly described. However, this processing is complex in practice. An embodiment embodying this point will be described with reference to FIGS. 5 to 12.

Figure 5:
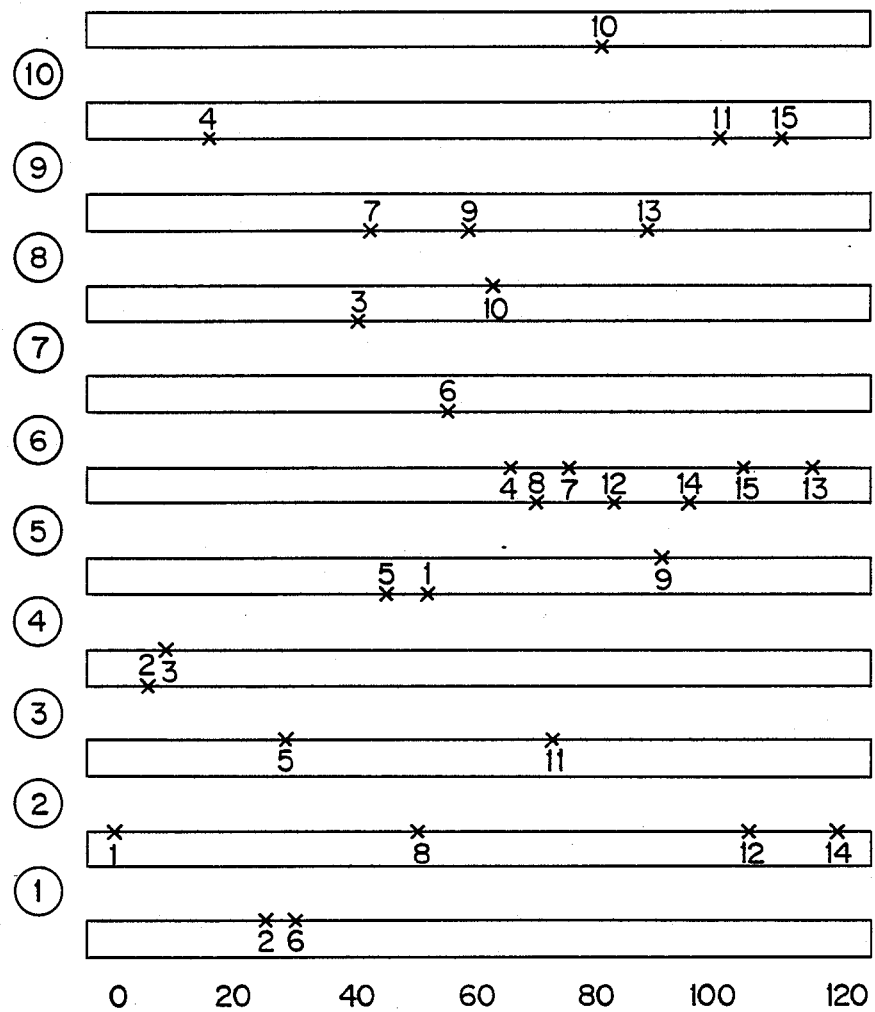

FIG. 5 shows a state wherein processing for determining wiring directions of terminals (steps 11 and 12 in FIG. 2) is completed, as in FIG. 4A. Referring to FIG. 5, 1, 2, . . . , 15 indicate names of nets. ①, ②, . . . , ⑩ indicate channel numbers. FIG. 6 is a view when necessary trunks are extracted for each net. In a combination of numbers like (5, 25), (8, 40), and so on, the former number represents a left-edge X-coordinate of a trunk, and the latter number represents a right-edge X-coordinate.

FIG. 7 shows trunks which are optimally arranged and combined using the left-edge algorithm. 15 trunks are distributed to five tracks. The steps from FIGS. 5 to 7 are the same as those from FIGS. 4A to 4C. More specifically, trunks 1 to 15 are extracted from nets 1 to 15 shown in FIG. 5. FIG. 6 illustrates these trunks 1 to 15 in accordance with their coordinates.

Within the range of coordinates 0 to 120, an optimal combination of trunks 1 to 15 is selected. For example, trunk 9 having the left-edge X-coordinate (58) adjacent to the right-edge X-coordinate (52) of trunk 1 is selected, and trunk 1 and 9 are combined. Furthermore, trunk 14 having the left-edge X-coordinate (95) adjacent to the right-edge X-coordinate (90) of trunk 9 is selected, and trunks 9 and 14 are combined. Therefore, trunks 1, 9, and 14 are assigned to a single track.

Similarly, trunks (2, 5, 8, 11, 15), (3, 7, 12), and (4, 13), and (6, 10) are combined, respectively, and these combinations are assigned to the corresponding tracks. In this manner, the trunk arrangement pattern shown in FIG. 7 can be obtained.

The step of assigning main lines arranged on a single track to a channel in accordance with the result of FIG. 7 is the same as in step 16, in FIG. 2. In the trunk assignment to the channel ⑥, a combination of nets (6, 10) is assigned to channel and FIG. 8 illustrates a state wherein these nets (6, 10) are subjected to the feed-through wiring.

Figure 8:
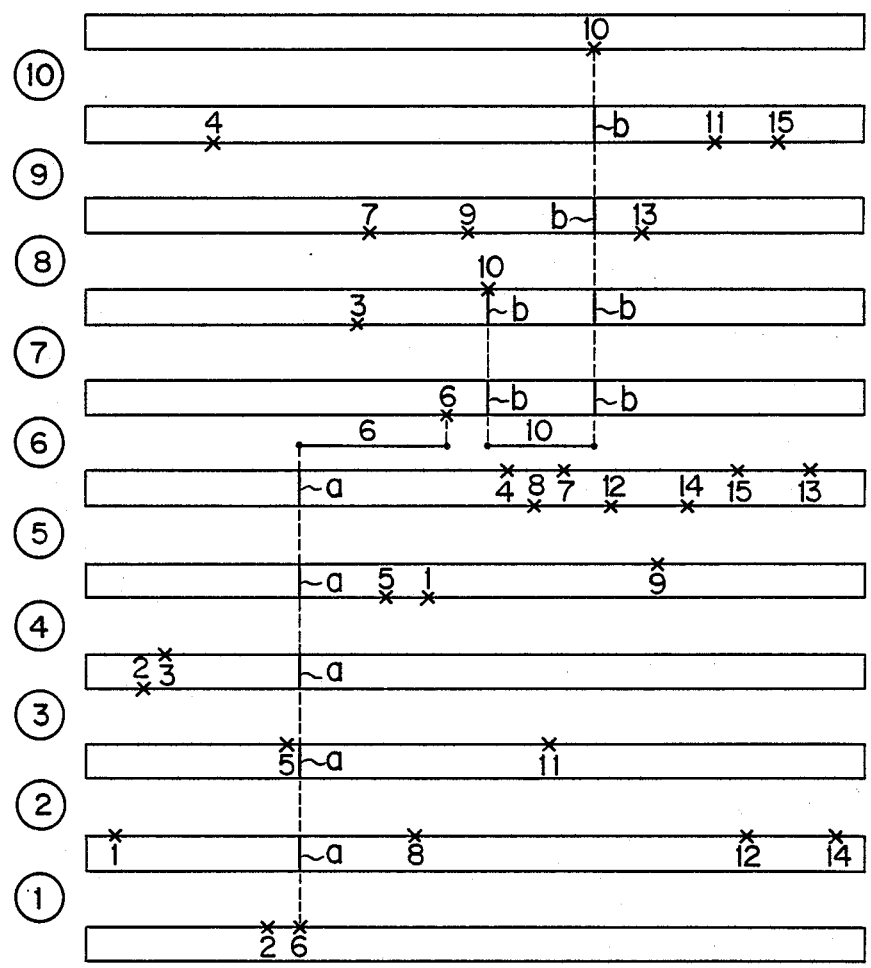
FIG. 8 is a view showing a wiring pattern causing detour wiring in through wiring.

Referring to FIG. 8, a and b represent through wiring positions of nets 6 and 10, respectively. Paying attention to net 10, a total of six through wiring routes are used, and a wiring route is detoured, thus prolonging a wiring length. As for net 10, if trunks are assigned to one of channels ⑧ to ⑩, excess through wiring route is not required, and the wiring route is not detoured. However, if channels ⑧ to ⑩ are assumed to be trunk assignment channels of nets (6, 10), net 6 also poses the same problem as above. In this case, even if a combination of nets (6, 10) is assigned to any channel, one or both the nets cause excess use of through wiring and a detour of a wiring route. More specifically, when trunks of a combination of nets 6 and 10 are assigned to a single channel, the feed-through wiring increases and a detour wiring route occurs. Therefore, the trunks of net 6 are to be assigned to channels ①  to ⑥, and the trunks of net 10 are to be assigned channels ⑧ to ⑩.

Figure 9:
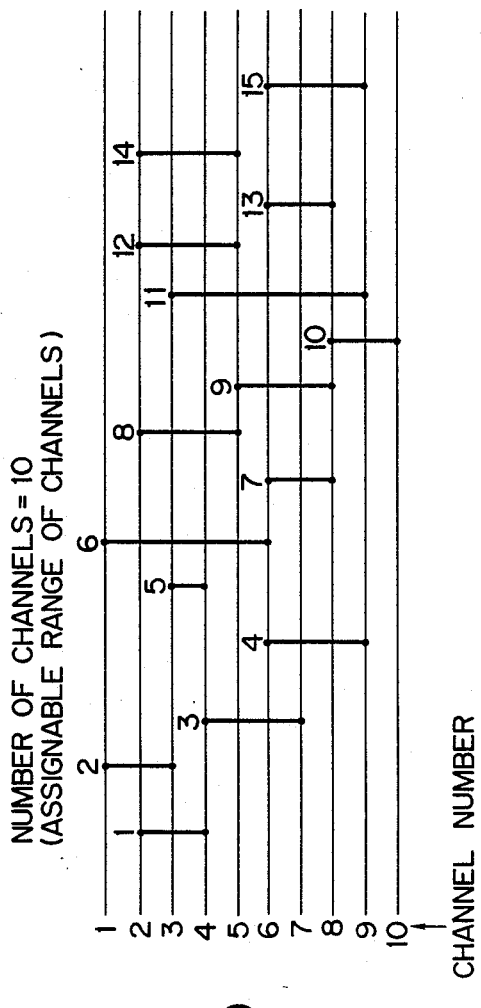
FIG. 9 is a view for explaining channel assignment for preventing detour wiring.

An assignable range of trunks to a channel is determined in accordance with cell rows on which both the terminals of each trunk are present. FIG. 9 shows channel assignable ranges respectively for nets 1, 2, ..., 15 shown in FIG. 5. As can be seen from FIG. 5, for example, trunk 1 can be assigned from the second to fourth channels, and trunk 2 can be assigned to the first to third channels. Within the channel assignable range, combinations of trunks 1 to 15 are selected.

Upon combination of nets (6, 10), the trunks of these nets can be arranged on an identical track. However, since trunks 6 and 10 are not present in an identical channel assignable range shown in FIG. 9, excess use of feed-through wiring and detour of a wiring route occur. In FIG. 7, there is no combination of channels common to a channel assignable range shown in FIG. 9, except for a combination of nets (4, 13). Trunk assignment to a common channel is preferably performed under the condition that nets having a common channel range determined according to cell rows on which cell terminals constituting the nets are present, are arranged on an identical track.

FIG. 10 is a flow chart showing a method for determining arrangement and combination of trunks having an assignable range to a common channel. This method is an extension of the left-edge algorithm shown in FIG. 3. After the flow starts, t=1 is set (step p1) in the same manner as in FIG. 3. In this case, t is a total number of tracks when trunks are arranged. A channel assignable range of trunks is given as c, and is initialized (step p2). In this case, a channel assignable range corresponds to all the channels. A trunk having a smallest left-edge X-coordinate is searched from the list of trunks (step p3). The searched trunk is assigned to a t-th track, and is then deleted from the list (step p4). These two steps are the same as steps e3 and e4 in FIG. 3. A common range between c and the channel assignable range of the trunks selected in step p4 is determined to update c (step p5). Then, a trunk having a common range to the channel assignable range obtained in step p5 and having a smallest left-edge X-coordinate is searched from sections of trunks having left-edge X-coordinates larger than the right-edge X-coordinate of the section of the trunk selected in step p4 (step p6). If YES in step p7, i.e., if a trunk satisfying step p6 is present, the flow returns to step p4, and the searched trunk is assigned to a t-th track. Then, the flow advances to steps p5 and p6. If NO in step p7, the flow returns to step p2 through step p8 of incrementing a track number by one (t=t+1). If in step p9 it is determined that the list of sections of trunks has not been deleted, the flow returns to step p2. On the other hand, if in step p9 it is determined that the list of trunks has been deleted, the flow ends.

Final value t in this flow chart serves as the number of tracks upon completion of arrangement and combination of trunks, in the same manner as in the flow chart of FIG. 3.

Figure 11:
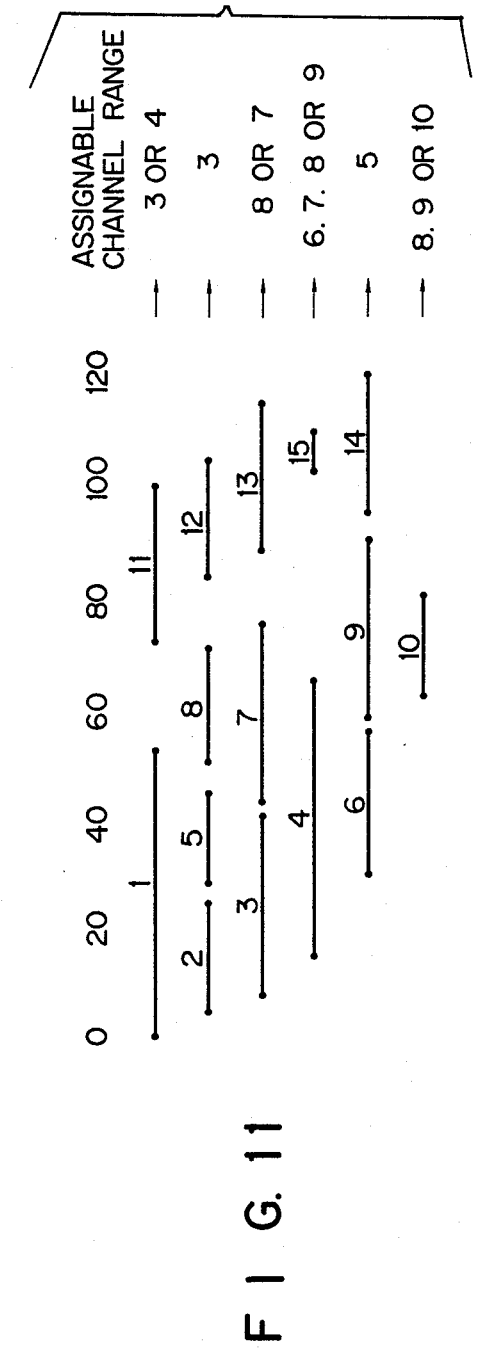
FIG. 11 is a view showing main line combinations obtained by the method shown in FIG. 10.

FIG. 11 shows the result of arrangement and combination of trunks based on the list of trunks shown in FIG. 4B and the channel assignable range shown in FIG. 9 using the method shown in FIG. 10. When FIGS. 7 and 11 are compared with each other, the number of tracks is 5 in FIG. 7, while the number of tracks is 6 in FIG. 11 and is increased only by one. However, in FIG. 11, since combinations (1, 11), (2, 5, 8, 12), (3, 7, 13), (4, 15), (6, 9, 14), and (10) of nets respectively have a common channel assignable range, the problems of excess use of feed-through wiring and detour of a wiring route described with reference to FIG. 8 are solved.

In the range of the embodiments described with reference to FIGS. 4 to 11, the description has been made using all the nets requring the feed-through wiring, each of which includes two terminals, i.e., two-terminal nets as models. However, nets including three or more terminals are present in practice. As will be described later, nets requiring the feed-through wiring include nets which do not require trunks. In consideration of these points, trunk assignment to channels requires still complex processing in practice. An embodiment embodying these points will be explained with reference to FIGS. 12A to 15.

Figures 12A, 12B:
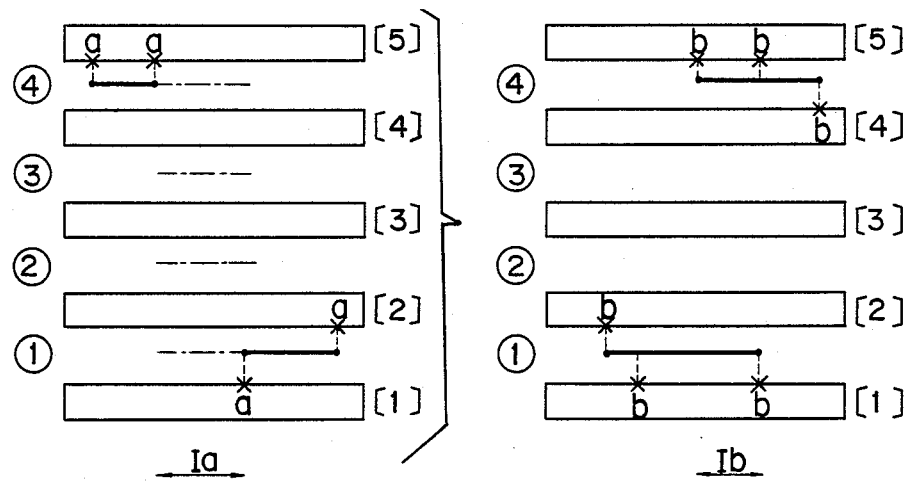
FIGS. 12A and 12B are views showing two types of through wiring using three terminals or more.

FIGS. 12A and 12B respectively show nets requiring trunks (FIG. 12A) and nets requiring no trunks (FIG. 12B) of the nets requiring the feed-through wiring and having three or more terminals. In FIGS. 12A and 12B, ①, ②, ... are channel numbers, and [1], [2], ... are numbers of cell rows. Net a in FIG. 12A includes four terminals, and section Ia requiring trunks. A channel assignable range of section Ia corresponds to channels ① to ④, indicated by alternate long and short dashed lines in FIG. 12A. Net b shown in FIG. 12B includes 6 terminals, and requires the feed-through wiring for cell rows [2], [3], and [4]. However, no new trunk is required in this feed-through wiring. This is because overlapping portion Ib is present between a trunk necessary for connecting three terminals b facing channel ① and a trunk necessary for connecting three terminals b facing channel ④, and if the feed-through wiring is assigned to an X-coordinate corresponding to overlapping portion Ib, no new trunk is necessary. Therefore, nets requiring the feed-through wiring should be further classified into nets requiring trunks (to be referred to as Type I hereinafter), and nets requiring no trunks (to be referred to as Type II hereinafter). For Type I nets, main line assignment to channel and subsequent through wiring position assignment are performed. For Type II nets, through wiring positions are assigned to sections where trunks overlap each other.

Figure 13:
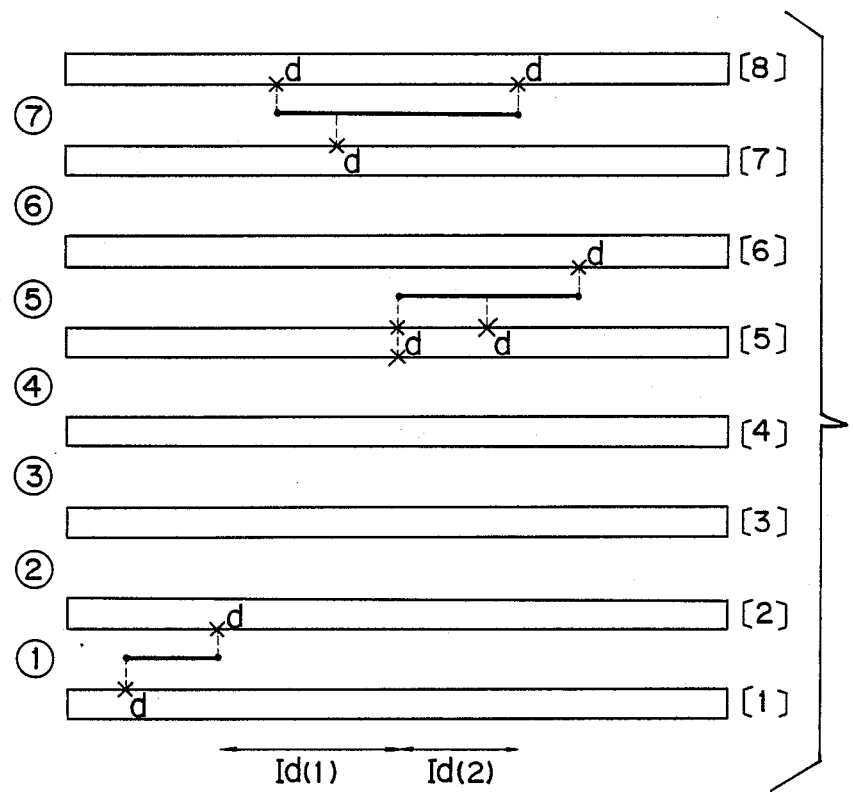
FIG. 13 is a view showing an example wherein the two types of through wiring are included in a single net.

FIG. 13 shows an example wherein a single net includes both Type I and Type II portions. In FIG. 13, net d is a net requiring the feed-through wiring and has 8 terminals. Through wiring must be performed for cell rows [2], [3], [4], [6], and [7]. However, in cell rows [2], [3], and [4], a section requiring a trunk is Id (1), and the net of this section is of Type I. In cell rows 6 and 7, a trunk necessary for connecting terminals facing channels ⑤ and ⑥ includes overlapping portion Id (2), and no new trunk is required. The net of this overlapping portion is of Type II. More specifically, nets requiring the feed-through wiring can be classified into Type I and Type II nets using cell rows requiring continuous through wiring as one group, i.e., cell rows [2], [3], and [4] as one group and cell rows [6], and [7] as the other group in FIG. 13. Therefore, processing for dividing each net into Type I and Type II portions is necessary.

Figure 14:
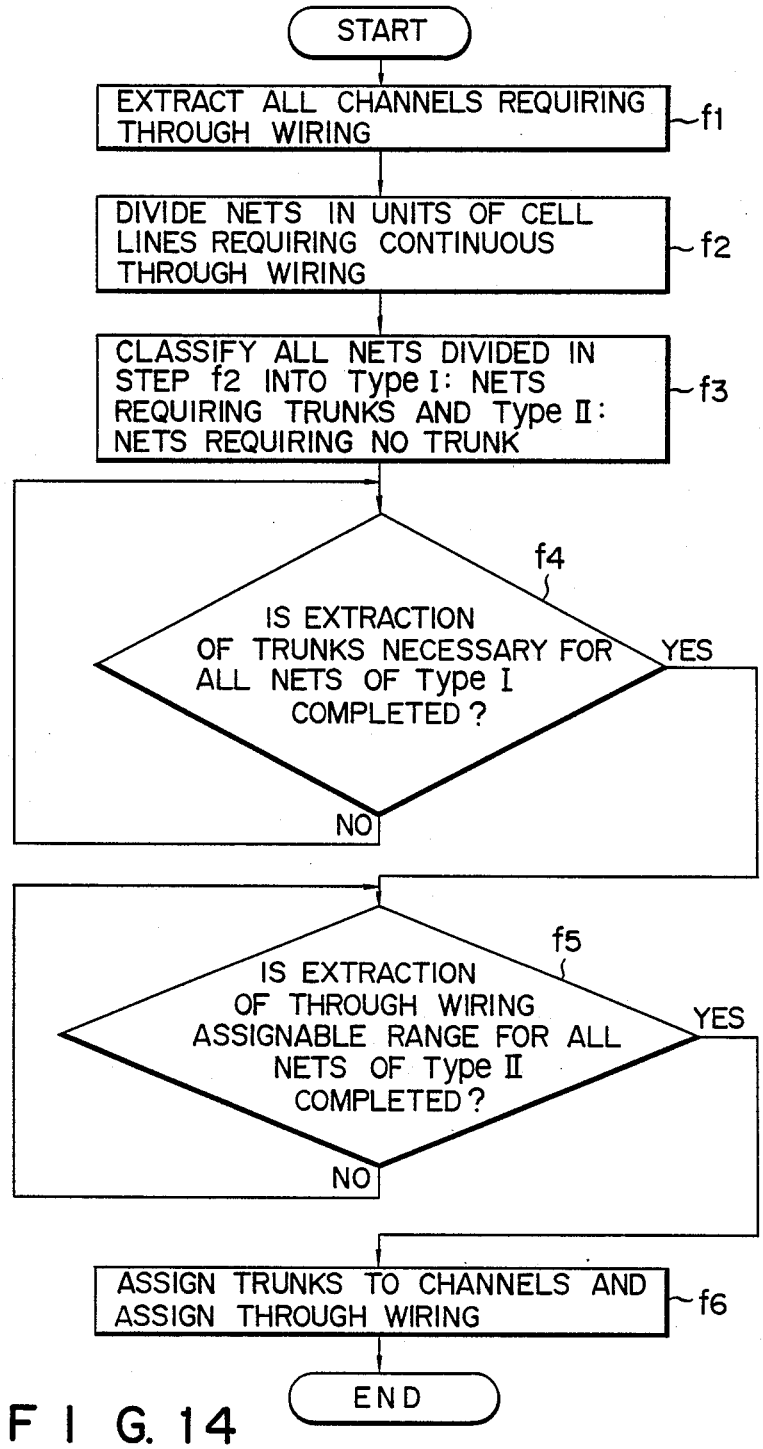
FIG. 14 is a flow chart showing net-type classification processing.

FIG. 14 is a flow chart for type classification processing of nets requiring the feed-through wiring. The flow chart shown in FIG. 14 is a detailed flow chart of steps 3 and 4 in FIG. 2 as a basic processing flow of the present invention. If all the nets requiring the feed-through wiring are extracted (step f1), the extracted nets are divided using cell rows requiring continuous through wiring as a group (step f2). Nets a and b shown in FIGS. 12A and 12B are not divided. However, net d shown in FIG. 13 is divided into a group of cell rows [2], [3], and [4], and a group of cell rows [6]and [7]. Each net divided in step f2 is classified into Type I requiring trunks and Type II requiring no trunks (step f3). Trunks necessary for each net are extracted until extraction of Type I nets are completed (step f4), and a through wiring assignable range is extracted until extraction of Type II nets is completed (step f5). If the extraction of Type II nets is determined to have been completed (step f5), trunks are assigned to channels and through wiring is assigned (step f6), and thereafter the flow ends. If in step f5 it is determined that extraction of Type II nets has not been completed, the flow is looped back through step f5 until the extraction of Type II nets is complete.

For Type I nets, arrangement and combination of trunks are performed by the processing described with reference to FIG. 10. For Type II nets, through wiring assignment is performed by the processing flow shown in FIG. 15. In step g1 if it is determined that an assignment of through wiring positions for all nets of Type II has been completed, the flow ends. However, if in step g1 it is determined that the assignments have not been completed, the flow proceeds to steps g2 and g3 before looping back to step g1. More specifically, when through wiring assignment for Type II nets is started, nets are sequentially extracted in a given order, e.g., in the order of left-edge X-coordinates (step g2). Through wiring positions are assigned to the extracted nets (step g3). In this case, the through wiring position is determined so that the feed-through wiring can be assigned to an identical X-coordinate within the through wiring assignable range as described above.

In the above-mentioned embodiments, no reference is made to the relationship between a through wiring position determined after assignment of trunks of Type I nets to channels and a through wiring position realized in an actual cell. In general, a cell includes a portion where passage of wiring is inhibited, and the above two through wiring positions do not always coincide with each other. FIG. 16 shows an example of such a state. In FIG. 16A, when nets a and b are assigned to an identical channel, t1 and t2 of a lower cell row and t3 and t4 of an upper cell row are determined as through wiring positions. However, assume that cell C2 where position t1 is present inhibits passage of wring. In this case, if feed-through cell CF1 is provided between cells, as shown in FIG. 16B, a trunk of net a is extended by a width of cell CF1, and as a result, trunks of nets a and b overlap each other and occupy two tracks.

In order to effectively prevent such a problem, the length of a necessary trunk can have a margin in advance. More specifically, as shown in FIG. 17, left-edge point X1 and right-edge point X2 of a necessary trunk of a Type I net are respectively extended to the left and right by predetermined small widths $\alpha$ and $\beta$, and points $(X1-\alpha)$ and $(X2+\beta)$ are employed as virtual left- and right-edge points. In the step of determining optimal arrangement and combination of trunks of the Type I net (step 5 in FIG. 2), the arrangement and combination processing is executed based on the updated coordinates. Upon updating of edge-point coordinates of the trunks, an increase in the number of tracks caused by a deviation between a through wiring position determined by trunk assignment to the channels and that realized in an actual cell taking a wiring passage inhibition region into account can be effectively suppressed.

In the above embodiment, the through wiring positions of the Type I net correspond to two edge points of the necessary trunk. If the trunk has a large length and a channel assignable range is wide, the trunk is divided into two or more sections, and the sections are arranged and combined as different trunks. Thus, processing for assigning trunks to channels can be included in the basic processing flow of the present invention.

FIG. 18 shows an example wherein the necessary trunk is divided. In FIG. 18, ①, ②... represent channel numbers. Net a in FIG. 18 is of Type I requiring the feed-through wiring. Since the necessary trunk is long, and the channel assignable range is wide, the trunk is divided into three sections a1, a2, and a3, and the channel assignable range is divided into three ranges, e.g., channels ① to ⑤ for section a1, channels ⑥ to ⑩ for section a2, and other section a3, accordingly. Three sections a1, a2, and a3 are used as different new trunks, and can be applied to the flow for arranging and combining the trunks shown in FIG. 10. With this processing, arrangement and combination of trunks and a portion of a cell capable of the feed-through wiring can be effectively used to improve a degree of integration.

According to the embodiments described above, optimal arrangement and combination of trunks and trunk assignment to channels can be performed, and a high-integration polycell style type integrated circuit can be obtained.

According to the present invention as described above, processing is not sequentially performed in units of nets in assignment processing of feed-through wiring, but all trunks are extracted, and optimal arrangement and combination of trunks are obtained, thereby assigning trunks to channels and determining through wiring positions. Therefore, almost optimal through wiring can be determined, and a degree of integration of a polycell style type semiconductor integrated circuit chip can be improved.

What is claimed is:

1. A method for wiring a semiconductor integrated circuit device having a plurality of cell rows each containing a plurality of cells respectively having cell terminals, and channel regions arranged between adjacent cell rows, comprising:
   a first step of assigning wiring routes for globally wiring cells of said plurality of cell rows to said cell rows and said channel regions, in accordance with a wiring request for realizing a predetermined circuit operation to obtain a plurality of nets with each net of said plurality of nets having at least a single X line and a single Y line;
   a second step of extracting trunks, extending along said channel regions from said nets;
   a third step of combining said trunks into a plurality of trunk groups, in accordance with X-coordinates of said trunks, and assigning the trunk groups to tracks of said channel regions; and
   a fourth step of determining a position of at least one cell row through which the Y line of each net of said plurality if nets passes, in order to perform through wiring for the cells corresponding to each of said plurality of nets.

2. A method according to claim 1, wherein the third step includes a sub-step of dividing at least one of said nets into a plurality of trunks, in accordance with coordinates of the corresponding cell rows and terminals of the cell, and a sub-step of connecting at least one of said nets, using a branch perpendicular to said divided trunks.

3. A method according to claim 1, wherein the third step includes a sub-step of determining coordinates of virtual two edges, using said trunks as segments having a length greater, by a given margin, than an actual value, and a sub-step of assigning said trunks to the tracks, based on the coordinates of the virtual two edges.

4. A method according to claim 1, wherein the third step includes a sub-step of determining an assignable range of channel regions with respect to two edges of each of said nets, and a sub-step of selecting other nets each having at least a common portion of ranges of the channel regions to be assigned and having a trunk having a distal edge adjacent to a rear edge of the trunk of each of said nets, and combining these trunks in the trunk groups.

5. A method according to claim 1, wherein the second step includes a sub-step of dividing at least one of said trunks into a plurality of line segments and extracting the line segments, and the third step includes a sub-step of combining the divided line segments with other trunks.

6. A method according to claim 1, wherein the third step includes a sub-step of detecting coordinates of two edges of the extracted trunks, and a sub-step of arranging another trunk having a coordinate adjacent to the coordinate of at least one of the two edges of each of said trunks.

7. A method according to claim 6, wherein the third step includes a sub-step of connecting the cell terminals of said nets, which have a common channel determined by the cell row corresponding to the cell terminals constituting each of said nets, through a common track.

8. A method for wiring a semiconductor integrated circuit device having a plurality of cell rows which are formed on a semiconductor chip and are arranged along an X direction, and each of which is constituted by a plurality of cells having terminals, and channel regions arranged between the adjacent cell rows, comprising:
   a first step of assigning wiring routes for globally wiring cells of said plurality of cell rows to said cell rows and said channel regions selectively having at least one track, in accordance with a wiring request for realizing a predetermined circuit operation to obtain a plurality of nets each having at least a single X line and a single Y line;
   a second step of extracting a plurality of X lines, extending along said channel regions, from said nets;
   a third step of combining said X lines in a plurality of line groups, in accordance with X-coordinates of said X lines, and assigning the line groups to tracks of said channel regions; and
   a fourth step of determining a position of at least one cell row through which the Y line of each net of said plurality of nets passes, in order to perform through wiring for the cells corresponding to each of said plurality of nets.

9. A method according to claim 8, wherein the second step includes a sub-step of dividing at least one of the X-lines into a plurality of line components and extracting the line components, and the third step includes a sub-step of combining the line components with main lines of other nets.

10. A method according to claim 8, wherein the third step includes a sub-step of dividing at least one of said nets into a plurality of X lines, in accordance with coordinates of the corresponding cell rows and terminals of cells, and a sub-step of connecting the at least one of said nets using a line perpendicular to said divided X lines.

11. A method according to claim 8, wherein the third step includes a sub-step of determining coordinates of virtual two edges, using said X lines as lines having a length greater, by a given margin, than an actual value, and a sub-step of assigning said X lines to the tracks, based on the coordinates of the virtual two edges.

12. A method according to claim 8, wherein the third step includes a sub-step of detecting left- and right-edge coordinates of the extracted X lines, and a sub-step of arranging, in an identical tack, other X line having left-edges adjacent to the right-edges of said X line.

13. A method according to claim 12, wherein the third step includes a sub-step of connecting the terminals of cells of said nets, which have a common channel determined by the cell row corresponding to the terminals of cell constituting each of said nets, through a common track.

* * * * *